United States Patent [19]

Slamka et al.

[11] Patent Number: 4,484,329
[45] Date of Patent: Nov. 20, 1984

[54] APPARATUS FOR THE DYNAMIC IN-CIRCUIT ELEMENT-TO-ELEMENT COMPARISON TESTING OF ELECTRONIC DIGITAL CIRCUIT ELEMENTS

[75] Inventors: Milan Slamka, Weston; Mamdouh H. Rassem, Mississauga, both of Canada

[73] Assignee: Thalamus Electronics, Inc., Mississauga, Canada

[21] Appl. No.: 291,727

[22] Filed: Aug. 10, 1981

[30] Foreign Application Priority Data

Aug. 18, 1980 [CA] Canada .................................. 358461

[51] Int. Cl.³ .............................................. G06F 11/00
[52] U.S. Cl. ........................................ 371/25; 371/20; 371/26; 324/73 R; 324/73 AT
[58] Field of Search ....................... 371/20, 25, 26, 15; 324/73 R, 73 AT, 73 PC

[56] References Cited

U.S. PATENT DOCUMENTS

| | | | |
|---|---|---|---|
| 3,614,608 | 10/1971 | Gledd et al. | 324/73 R |
| 3,684,960 | 8/1972 | Conley, Jr. et al. | 324/73 PC |
| 4,001,818 | 1/1977 | Radichel et al. | 371/25 |
| 4,039,813 | 8/1977 | Kregness | 371/26 |
| 4,055,801 | 10/1977 | Pike et al. | 371/25 |
| 4,099,119 | 7/1978 | Goetz | 324/73 PC |
| 4,125,763 | 11/1978 | Drabing et al. | 324/73 R |
| 4,139,147 | 2/1979 | Franke | 371/25 |
| 4,168,527 | 9/1979 | Winkler | 364/580 |
| 4,230,986 | 10/1980 | Deaver et al. | 324/73 PC |
| 4,270,178 | 5/1981 | Lillig | 371/25 |
| 4,271,515 | 6/1981 | Axtell et al. | 371/25 |
| 4,287,594 | 9/1981 | Shirasaka | 371/25 |
| 4,290,015 | 9/1981 | Labriola | 324/73 PC |
| 4,312,067 | 1/1982 | Shirasaka | 371/25 |

OTHER PUBLICATIONS

*IBM Technical Disclosure Bulletin*, J. M. Elmore et al., "Automatic Fault Isolation for Digital Assemblies", vol. 14, No. 12, May 1972, pp. 3767-3770.

*Primary Examiner*—Joseph F. Ruggiero
*Assistant Examiner*—Gary V. Harkcom
*Attorney, Agent, or Firm*—Hirons, Rogers & Scott

[57] ABSTRACT

Apparatus for the dynamic in-circuit testing of digital electronic devices employs a hardware testing circuit that is set by a microcomputer which takes no direct part in the test, so that the test hardware speed is not limited by the computer speed. The apparatus comprises a library of devices equivalent to the devices to be tested, the library including a ROM containing the information regarding the devices needed by the microcomputer for its purpose. An internal interface or router receives signals from the test device that are input signals to its terminals and routes them directly to the corresponding selected device in the library where it becomes an input to that device also. Signals from the test device that are output signals are routed instead to a comparison block where they are compared with the respective output signals from the library reference device. The signals at each corresponding pin of the two devices are compared and upon the presence of a fault the apparatus stops and identifies the pin or pins on which a fault has been detected. An external interface is provided to shift the signal levels as required between the test device and the transistor-transistor logic devices of the apparatus. The signals are sampled during timed periods to account for different propagation times through the apparatus, and different operating speeds of the devices. Provision is made for external or internal clocks, reset and ground connections.

28 Claims, 11 Drawing Figures

APPARATUS FOR THE DYNAMIC IN-CIRCUIT ELEMENT-TO-ELEMENT COMPARISON TESTING OF ELECTRONIC DIGITAL CIRCUIT ELEMENTS

FIELD OF THE INVENTION

This invention is concerned with apparatus for the dynamic in-circuit element-to-element comparison testing of electronic digital circuit elements.

DESCRIPTION OF THE PRIOR ART

The continuing development of electronic digital circuit elements, and electronic circuits including such elements, of greater diversity and complexity is accompanied by corresponding increases in the difficulty and expense of testing them quickly and adequately, either during assembly of the circuit or subsequently after the circuit has been in use for some time. Such testing is important commercially, since the sale of equipment with too high an incidence of faults will result in loss of reputation for quality, while if the testing is unduly difficult and time-consuming, requiring expensive skilled manpower for its implementation, then the resultant increase in the servicing cost may be unacceptable.

Traditional forms of test gear such as oscilloscopes and logic analyzers require a high degree of skill in the test operator. In the application of another technique known as signature analysis a known bit stream is passed through the digital circuit and the resultant "signature" produced by that bit-stream examined for response at different points in the circuit. In a further technique a microprocessor or the like under test is replaced with an emulating microprocessor which controls the circuit in its place; such a system can only indicate that a malfunction exists in the devices on the bus but not the location of the malfunction. Simple replacement of an entire faulty circuit board is also employed, but is expensive in inventory, and subsequently the faulty board must be examined for repair.

It is of course known to test a circuit element by direct comparison with a pre-tested sample of the same element, since this reduces the amount of information required to determine whether or not the tested element is satisfactory. However, such testing has been difficult and time-consuming with known arrangements. A typical circuit board will carry a wide variety of different elements to be tested, all of which usually are operative with different parameters that must be pre-set before the particular element can be tested. If a number of similar boards are to be tested, the same element on all the boards can be examined one after the other while the test equipment is set for that element, but this then involves moving from board to board between each test.

SUMMARY OF THE INVENTION

It is therefore an object of the invention to provide a new apparatus for the dynamic in-circuit element-to-element comparison testing of electronic digital circuit elements.

It is a more specific object to provide such apparatus with which an element is tested rapidly while operative in its circuit by direct comparison with the same or an equivalent element provided by the testing apparatus, using for comparison purposes the signals of the test element produced in the usual actual operation of the circuit in which the element is connected.

In accordance with the present invention there is provided apparatus for the dynamic in-circuit, element-to-element comparison testing of an electronic digital test circuit element while operative in its circuit comprising:

means for accessing at least the operative terminals of the test element for its connection to the apparatus and consequent receipt from the said operative terminals thereof of the respective electric signals produced in the usual operation of the circuit in which the test element is connected;

library means including a plurality of different reference elements and memory means having therein information as to the operating parameters of each of the said reference elements, each reference element being the same as or equivalent to the test element, and each having terminals corresponding to the respective terminals of the respective test element;

computer means for interrogating the memory means and subsequently effecting powering of a selected reference element in accordance with the said information read by the computer means in the memory means for the selected reference element;

signal comparison means for comparing the usual operation electric signals at the said operative terminals of the test element with the corresponding signals at the respective terminals of the reference element and for producing a fault indication if the comparison indicates the presence of a fault;

means for feeding a signal which is an input signal at a terminal of the test element from said accessing means to the corresponding terminal of the reference element, and for feeding a signal which is an output signal at a terminal of the test element to the signal comparison means; and means for feeding a signal which is an output signal at a terminal of the reference element to the signal comparison means for comparison with the respective output signal from the test element.

The present invention also comprises a library module for use in such apparatus, the library module comprising:

a circuit board having thereon a plurality of busbars;

a plurality of electronic digital reference elements connected to the said busbars to permit the selective access to the terminals of each reference element; and a memory means connected to the said busbars for access by a memory interrogation means, said memory means having therein information for each reference element consisting of:

(a) identification of the respective reference element, (b) identification of the busbars that are accessed for access to the respective reference element, (c) identification of the status of each operative contact of the respective reference element as to whether it is an input terminal, an output terminal, or a bidirectional terminal which may in operation be alternatively an output terminal or an input terminal.

Further in accordance with the present invention there is provided apparatus for the dynamic in-circuit, element-to-element comparison testing of an electronic digital circuit element while operative in its circuit comprising:

means for accessing at least the operative terminals of the test element for the connection of the test element to the apparatus;

library means including a plurality of individually selectable different reference digital elements, each of which can constitute a reference digital element the same as or equivalent to a respective test element and having terminals corresponding to the respective terminals of the respective test element, and memory means having therein information as to the operating parameters of each of the said reference elements;

means for comparing a test signal at each operative terminal of the test element produced in the usual operation of the circuit in which the test element is connected with a corresponding signal which is a reference signal at the respective terminal of the reference element and for indicating a fault condition when the compared test and reference signals are different;

computer means for interrogating the memory means and subsequently effecting powering of a selected reference element in accordance with the said information read by the computer means in the memory means for the selected reference element;

means for connecting said accessing means, said selected, powered reference element and said comparing means; and routing means routing test signals which are input signals, test signals which are output signals and test signals which are bidirectional signals from said accessing means to the said comparing means, and routing test signals which are input signals and test signals which are bidirectional signals in input signal mode from the accessing means to the respective terminals of the said reference element;

said connecting means connecting the reference element and the comparing means for transmission of reference signals which are output signals and reference signals which are bidirectional signals in output mode to the comparing means.

DESCRIPTION OF THE DRAWINGS

Test apparatus which is a particular preferred embodiment of the invention will now be described, by way of example, with reference to the accompanying schematic drawings, wherein.

DESCRIPTION OF THE PREFERRED EMBODIMENT

The test apparatus illustrated is intended for the testing of elements made under current industry manufacturing standards wherein each element has the form of a rectangular block of either 7.5 mm or 15 mm width, provided along its two longer parallel sides with two respective rows of uniformly-spaced metal terminal pins. Currently such elements have from 14 to 40 pins, each of which depending upon the internal architecture may be a signal input terminal, a signal output terminal, or be bi-directional. For testing purposes with this embodiment an element is temporarily connected to the test apparatus while normally operative in its circuits by use of a known type of spring-jawed clip, the opposed jaws of which carry respective sets of electric contacts each arranged to engage a respective pin when the clip is clamped on the element. A multi-wire cable carries signals from the jaw contacts and thus to and from the respective pins, so that the test apparatus employs the signals that are provided by the usual actual operation of the circuit in which the element is connected.

In addition to the clip the apparatus provides five other leads as follows:

(1) A ground lead for connection to the ground of the board on which the device is mounted, (2) A lead (EX CLK) to connect to the external clock or its equivalent on the test board, (3) A lead (INT CLK) to provide an internal clock from the apparatus to the test board if such is a clock needed, or if the test clock is too fast for the apparatus, (4) A lead (INT CLK) providing the complement of (3), and (5) An external lead for giving a reset signal to restart a programmable device or board operation when required.

Figure 1:
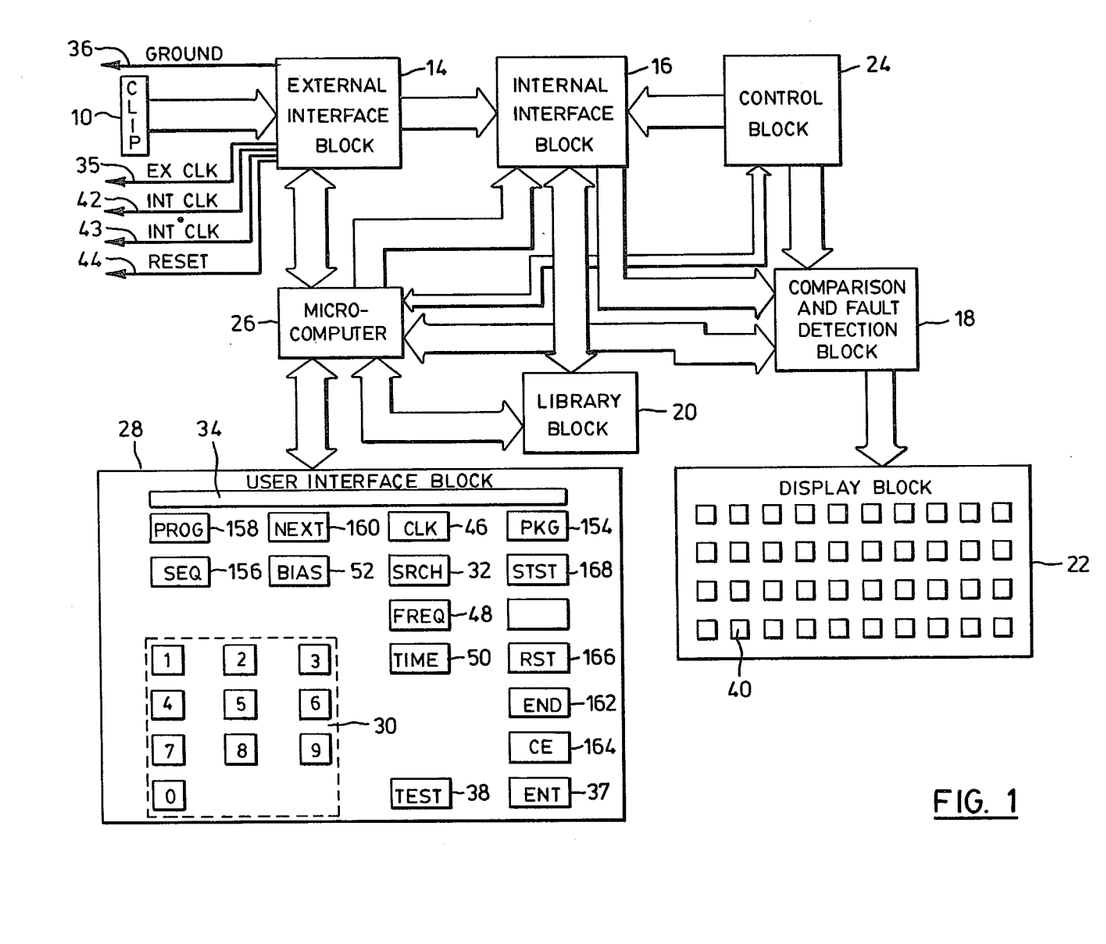
FIG. 1 is a generalised block diagram of the preferred embodiment.

Turning now to FIG. 1, the jaw contacts of such a clip 10 are connected via a cable 12 to corresponding contacts of an external interface (E.I.) block 14, which is in turn connected to an internal interface (I.I.) block 16. Signals from the I.I. block may pass directly to a comparison and fault detector (C.F.D.) block 18, or may go to a library block 20, as will be described below. Signals also pass from the library block 20 to the C.F.D. block 18 and signals indicating the "status" of each of the operative pins of an element under test are passed from the C.F.D. block 18 to a display block 22, which in this embodiment gives a visual display. It will be understood that for example in an embodiment employed in an automatic test facility such a visual display may not be necessary and may be omitted or replaced by some other unit as required by the purchaser for indicating that the tested element has passed or failed the test and/or taking some action depending upon pass or failure of the test.

Certain control functions to be described below, particularly those required during a test, are performed by a control block 24, which has direct access to the I.I. block 16 and C.F.D. block 18, while other functions required in preparation for and following a test are performed by a microcomputer 26, which has direct access to all of the blocks with the exception of the display block 22. Microcomputer 26 also has access to a user interface block 28 including a keyboard and alphanumeric display by which a human operator can insert necessary information into the apparatus and also receive information, prompts and commands therefrom.

As with display block 22, the configuration of the user interface block 28 will also depend upon whether a human operator is required, or whether the test apparatus is being run by a machine. The function of each of the above-described blocks and their inter-relation with one another will be described below.

The operation of apparatus of the invention depends upon the presence in the library block 20 of a device or element that is equivalent to the device to be tested, i.e. it is a duplicate device or can be made to operate as if it were a duplicate of the tested device. Such duplication of the tested device may be for example by adjustment of the voltage levels and/or timing of the input/output signals involved. This may be contrasted with test apparatus of the kind employing a microcomputer in which the microcomputer software or firmware is written so that the microcomputer will simulate the device under test, requiring complete and detailed information as to the operation of the device as well as the signals involved in its operation.

The library block consists of at least one board, usually a plurality of boards, each of which has connected to the busbars thereof a plurality of devices that are to be tested, all wired to the busbars to permit individual access to each element and also to the pins of each element as required. Each such board can consist, for example, of a group of dissimilar elements all from the same manufacturer, or a group of similar elements, one from each of the available manufacturers, or a group of devices all of the same technology e.g. TTL; MOS; CMOS; DTL; ECL, etc. Again, each library board can be as identical as possible in content and layout to a circuit board that is to be tested, and this is particularly valuable in ensuring that heating conditions, time delays, intercouplings, leakages, etc. will be as nearly as possible the same.

Each library board also includes a read only memory means connected to appropriate busbars of the board and containing necessary information for each element on the board, such as its index number for operator identification, the identification of the board on which it is mounted, the library board bus coordinates that must be enabled and accessed to power the element and access its terminals, the status of each of the terminals of the element (i.e. whether it is an input, output or bidirectional terminal), the voltage bias levels required for operation, the speed of operation and the corresponding time delays that may be required for its signals to be compared with those of the test device, and the time required for a complete test of its operation. For economy in manufacture this memory preferably is a single central unit for the whole board, but of a type that can be re-programmed when required if any of the devices on the board is replaced by a different device.

Let it first be assumed that a human operator is to test a single element on a board having a clock signal that is directly usable by the test apparatus and of a kind that does not require a reset signal for its operation. Before commencing the test the operator will interrogate the test apparatus via the user interface 28 to determine whether or not the same or an equivalent device is in the library block. Each device to be tested and the reference device are identified to the operator by the above-mentioned identification number stored in the respective library board memory. The operator supplies this number to the microcomputer 26 via a numerical keypad 30 in the user interface 28 and then presses the search (SRCH) key 32, causing the microcomputer to search the library memories and display on an alpanumeric display unit 34 in the user interface 28 whether or not the device is in the library, and if so the library board on which it is located. If the search does not find a device with this identification the computer will provide the display unit 34 with an appropriate display such as "not available".

Once assured that the device can be tested the operator now connects EX CLK lead 35 to the board on which the device is mounted to receive the clock signal, connects ground lead 36 to the board ground, puts clip 10 on to the device and presses enter key 37 to enter the device identification data as shown on the display 34. The microcomputer now interrogates the respective library memory unit for the pertinent information on the selected device and also powers the selected device, so that it is in the same condition of operation as the external test device. At the same time the data about the selected device is employed by the microcomputer to set the E.I. block 14 to provide the required bias voltages; to set the I.I. block 16 so that it will properly route the signals it receives, as will be described below, and to set the control block 24 so that the latter will initiate and control a testing cycle for the selected device. This data about the selected device will be stored in suitable registers which may be provided in the microcomputer block or in the respective block to which the data has been transferred. If the register is in the respective block then once the data has been transferred to it the microcomputer can disable itself from further access to that register until there is a need to replace the data for a new test device. Having performed these functions the microcomputer enters on the display 34 an indication that a test is possible and then, except for various accessory functions described below, disables itself from taking any further part in the test per se.

The test element is in active condition in its circuit, which must be powered up for the test to be possible, so that the element is receiving the usual actual input signals and power supply or supplies that are available to it from its own board; the element will also be delivering output signals to the respective output terminals which, if the element is functioning properly, are the usual actual signals appropriate for the input signals and power that it is receiving. As described above the signal at a particular terminal pin of the test element will be supplied via clip 10 to the external interface, where its level will be changed if necessary as previously set by the microcomputer. If it is an input signal it is routed automatically by the I.I. block 16 to the C.F.D. block and also to the corresponding terminal pin of the library reference device and becomes an input to that device. If it is an output signal it is routed automatically by the I.I. block 16 to the C.F.D. block 18 and is prevented from access to the library reference element. If the signal is changing from input to output then in input mode it will be routed as above for an input signal while in output mode it will be routed as above for an output signal under control of a "toggle" signal supplied to the I.I. block 16.

Upon the operator pressing the test key 38 the control block 24 will now operate the I.I. block 16, the library block 20, and the C.F.D. block 18 to scan synchronously and simultaneously the pins of the external device and the same pins of the library device. The input signal on any input pin of the test device will be routed by the I.I. block 16 to the library reference device, while the output signal on any output pin of the test device will be routed directly to the C.F.D. block 18 to be compared with the signal from the same pin of the library reference device. It is usually preferred for a complete test to scan over a relatively large number of cycles since, in general, each such cycle takes only a small fraction of a second and the total time for an exhaustive test is very small as compared with the time required to move the clip 10 from one element to another. In the case when one or more of the pins are bi-directional a plurality of scans will be required until the device has been tested in all possible states, the I.I. block 16 routing the signal as required in dependence upon whether it is an input or an output.

The C.F.D. block 18 comprises a bank of combinatorial logic elements, forty in this particular embodiment since forty pin devices are to be tested, each of which compares the signal from the respective pin of the test device with that from the corresponding pin of the library reference device and feeds any output to a respective one of forty indicator devices 40 in the display block 22. Thus, if any one of the combination logic elements is fed two different digital signals the respective indicator will be actuated to show a fault condition on that pin, whereupon the operator will know not only that the device is faulty, but the pin or pins at which the fault or faults is occurring. An audible signal may also be employed to alert the operator that a fault is present. The clip can then be moved to another similar device and the test button 38 again pressed to obtain a test of the new device, and so on. At any time the status of the pins and whether or not a fault is present can be read by the microcomputer and this information supplied to the interface 28 or some other external apparatus.

It was assumed above that the device under test employed the clock signal from its own board, but frequently this is not the case, and a clock signal or complementary clock signal can be supplied from the microcomputer via the E.I. block 14 through respective leads 42 and 43, while a reset signal is supplied when required from the same block under control of the microcomputer through a lead 44. The direction of the clock signal to be supplied from the test apparatus is selectable, depending upon whether triggering occurs on the rising or falling edge of the clock pulse. The information as to what clock signal is required will be in the library memory, but needs to be fed to the microprocessor as an instruction. The operator therefore presses a clock key 46, whereupon the microprocessor will display the clock requirement for the device and a menu for operation of the numeric pad 30 to obtain the necessary signal; for example the menu will instruct the operator to press "1" for the microprocessor internal clock to supply the device with a clock signal of one polarity; press "2" for an internal clock signal with opposite polarity; and press "3" if an external clock signal is already provided.

It may be found that the external clock signal is too fast to be usable or for convenience in testing, in which case the internal clock will be selected by the operator. Upon insertion by the operator of the length of test required the microcomputer will calculate the number of test cycles required for this test duration and will terminate the test cycle upon expiry of this time. The microcomputer includes a frequency counter unit which is actuated by operation of a frequency key (FREQ) 48, whereupon the display 34 will display the actual frequency and polarity of the clock that is in use.

Upon the operator pressing a time key 50 the microcomputer will show in the display 34 the duration of the test to be made and a menu to change the time if this is not satisfactory. The required test duration is selected by keying the number of milliseconds via the numerical pad 30 and then pressing the enter key 36. This feature is used, for example, if the fault is known to be intermittent, or if a longer test time than usual is required, e.g. for a soaking test.

The circuits and logic arrangement of the various blocks will now be described in greater detail, other features of the apparatus also being described where this is appropriate.

External Interface Block 14

This constitutes a buffer of high input impedance between the test apparatus and the device being tested, so as not to unduly affect the operation of the test device, and also acts as a level translator to enable the test apparatus to deal with families of devices other than those used in the apparatus blocks. Thus, this particular preferred embodiment employs signal levels and logic thresholds characteristic of TTL logic devices and in the absence of the interface block 14 it could only conveniently test devices employing such levels and thresholds, since other types requiring different logic thresholds might not give signals that could be handled or even detected by the test apparatus. Part of the information stored in the library memory on each library board and supplied by the microcomputer to the external interface block is the bias level offset required to translate the digital signals received and transmitted by the E.I. block to the standard levels for TTL logic devices of a maximum of 0.8 volts for "0" and a minimum of 2.4 volts for "1". The operator presses a bias key 52 to be told the offset that has been given to the E.I. block by the microcomputer for the test device together with a menu for change if this should prove to be necessary. If necessary the number of millivolts of change required is set by the key pad 30 and entered by pressing the enter key 36.

Figure 2:
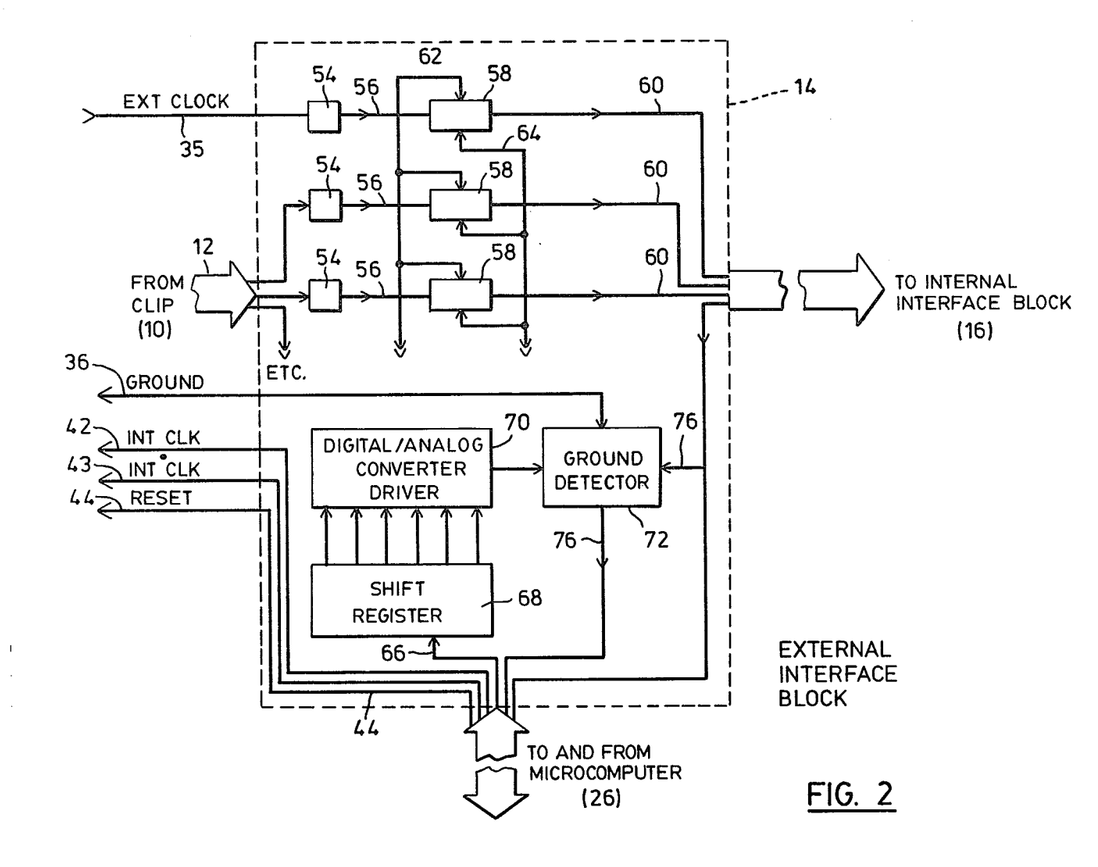
FIG. 2 is a more detailed schematic diagram of the external interface block of the preferred embodiment.

Referring now to FIG. 2, which shows in greater detail the circuit of the external interface block, the forty leads in the cable 12 and the signal clock lead 35 feed their signals to respective high input impedance amplifiers 54, while the corresponding forty one separate output leads 56 feed their signals to respective offset modules 58, each of which will accept the digital signal received on lead 56 and feed the corresponding TTL logic signal out on its output lead 60 to the I.I. block 16. An internal power unit (not shown) provides each offset module on input leads 62 and 64 respectively with the voltages appropriate to produce a TTL logic "1" or "0" on the output lead 60. The offset data from the microcomputer is also fed via a lead 66 to a shift register 68, which controls the output of a digital-/analog converter and driver 70 to produce a ground reference voltage for the signals from the offset modules. This analog ground signal is fed to a ground detector 72 which is also connected to the external ground lead 36. Upon detection of current flow between the two grounds the detector transmits a signal via lead 76 to the microcomputer that a ground reference is available and the test may proceed, and otherwise not.

Internal Interface Block 16

Figure 3:
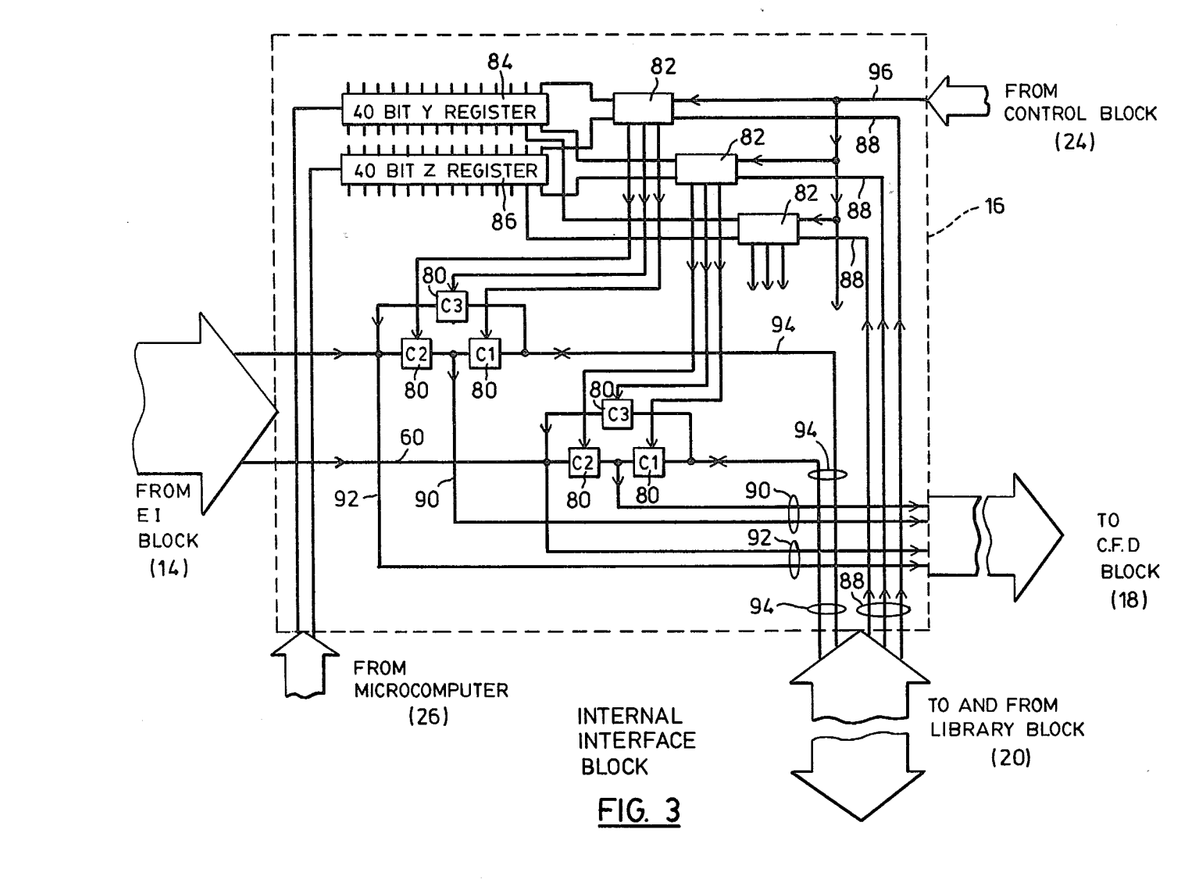
FIG. 3 is a more detailed schematic diagram of the internal interface block.

Referring now to FIG. 3, which shows in greater detail the circuit of the I.I. or routing block 16, each output lead 60 from E.I. block 14 constitutes an input lead to a respective set of three controlled switch devices 80 (designated $C_1$, $C_2$ and $C_3$ respectively) which set is controlled by a respective control block 82. The input to each control block 82 is from two separate 40-bit registers 84 and 86, called respectively the Y and Z register, which are supplied with the required information as to the status of the respective device pin from the library memory via the microcomputer 26. The bit signals received by each control block 82 from the Z and Y registers is used in combination with a toggle signal received from the library block via lead 88 to issue the necessary control signals to the switches $C_1$, $C_2$ and $C_3$. The two bit YZ input specifies whether the signal is an input or an output or a toggle, and the incoming toggle signal will in the latter case make the final determination between input and output as required. Thus, if the incoming signal is an input then the two switches $C_2$ and $C_3$ are closed while the switch $C_1$ is open and the signal is fed via leads 90 and 92 to the C.F.D. block 18 and via lead 94 to the library block 20. If the incoming signal is an output then the two switches $C_2$ and $C_3$ are open and the switch $C_1$ is closed, whereupon the signal from the E.I. block 14 cannot access the library device, but can access the C.F.D. block 18 via lead 92, while the corresponding output signal from the library device can return to the I.I. block via lead 94 and access the C.F.D. block via the lead 90.

A special situation arises when the device to be tested is of a kind, such as a shift register, which must be synchronised with the library device. In such case each control device 82 is issued a "synchronous mode" signal via lead 96; in this mode with an input signal the switches $C_1$ and $C_3$ are now open while switch $C_2$ is closed so that the signal can only input the C.F.D. block 18 via leads 90 and 92 and is blocked from the library device via lead 94, while with an output signal the switch $C_1$ is closed and both switches $C_2$ and $C_3$ are open so that access to the library device from the E.I. block is again prevented while the library device can feed to the C.F.D. block 18 via leads 94 and 90. The library device is therefore inactive in a specific pattern and the C.F.D. block will detect this as a fault, since it is immaterial to that block whether the "fault" is in the test device or the library device; the test device will cycle through different patterns and upon achieving a pattern corresponding to the "frozen" pattern of the library device the "fault" indication will disappear and the two devices now operate in synchronism. The C.F.D. block is controlled by the control block to ignore this "fault" for a predetermined period of time and if synchronisation is not achieved with this period the control block 24 then issues a restart signal to the cycle control to indicate this failure and put the apparatus in standby mode; at the same time the microcomputer block will provide an instruction "failure to synchronise" on the display 34, since the most likely reason is of course a faulty device.

Library Block 20

Figure 4:
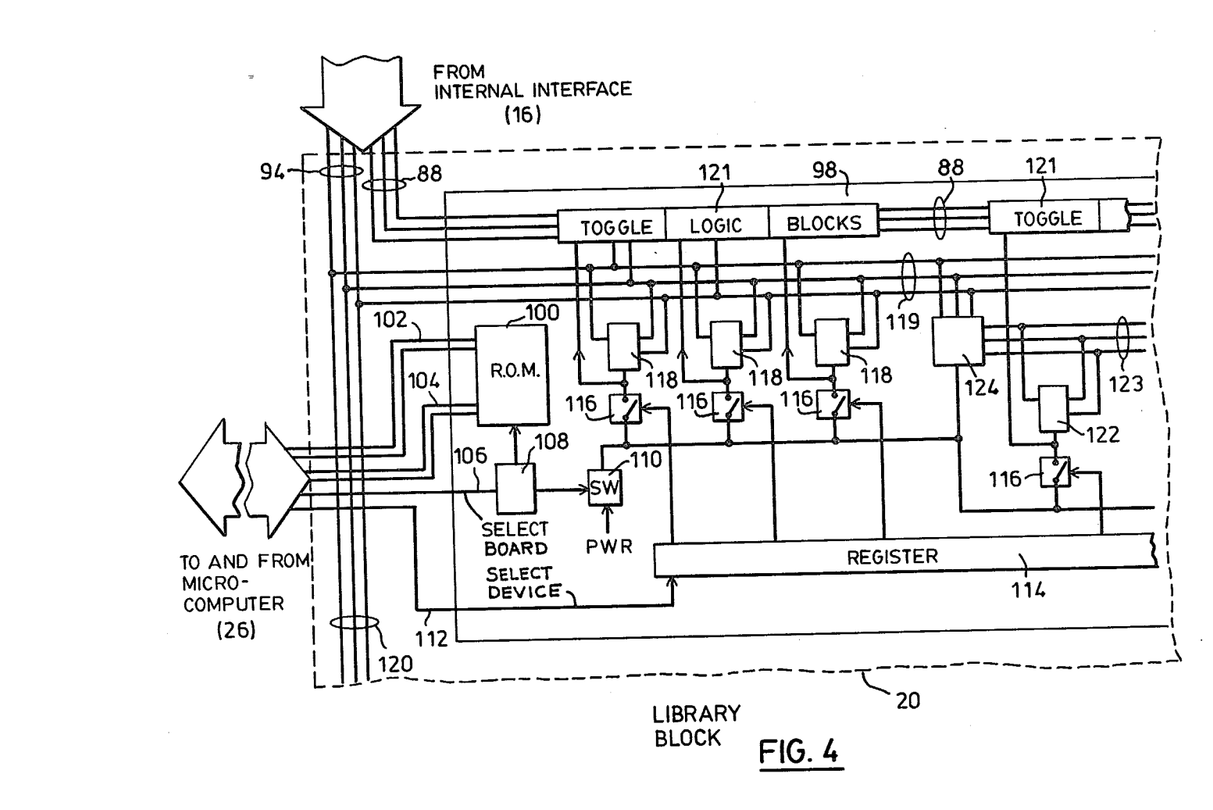
FIG. 4 is a more detailed schematic diagram of the library block.

FIG. 4 is a more detailed circuit drawing of a part of one library board in the library block although, as will be understood, a typical embodiment of the invention will usually comprise a number of different boards. As described above each board 98 includes a read only memory 100 connected by leads 102 and 104 respectively to the address and data busses of the microcomputer so that it can be interrogated and transfer its stored information to the microcomputer for utilisation and display. When the computer block has indentified the device to be selected, either by a preset program to be described below, or by an operator feeding this information to the computer block, the computer block will issue a "select board" signal on lead 106 to a control logic device 108 that will in turn close a switch 110 permitting power to be supplied to the board. At the same time the computer block issues a "select device" signal on lead 112 to a register 114 that in turn will cause closing of a respective switch 116 that will permit the powering up of the selected library device 118 corresponding to the test device. Each library device is connected via a board bus 119 to a library block bus 120 and by the leads 94 to the I.I. block 16. If the selected device is of a type in which one or more of the pins is bidirectional then the board also carries a respective toggle logic block 121 arranged for that device and which is selected by closing of the respective switch 116, this block feeding the toggle signal as described above on leads 88 to the I.I. block 16.

Since the test apparatus itself employs TTL logic levels such devices in the library are immediately compatible with the test apparatus circuits and can be connected directly to the board bus 119 and thence to the library bus 120. Devices such as device 122, corresponding to test devices that require offset voltages to be provided by the E.I. block 14, cannot be directly connected in this manner because of this inherent incompatability; instead they are connected to a sub-bus 123 that is connected to the board bus 119 via driver 124 providing to the sub-bus 123 the voltages required for proper operation of the device, this driver being enabled by the board select signal.

C.F.D. Block 18

Figure 5:
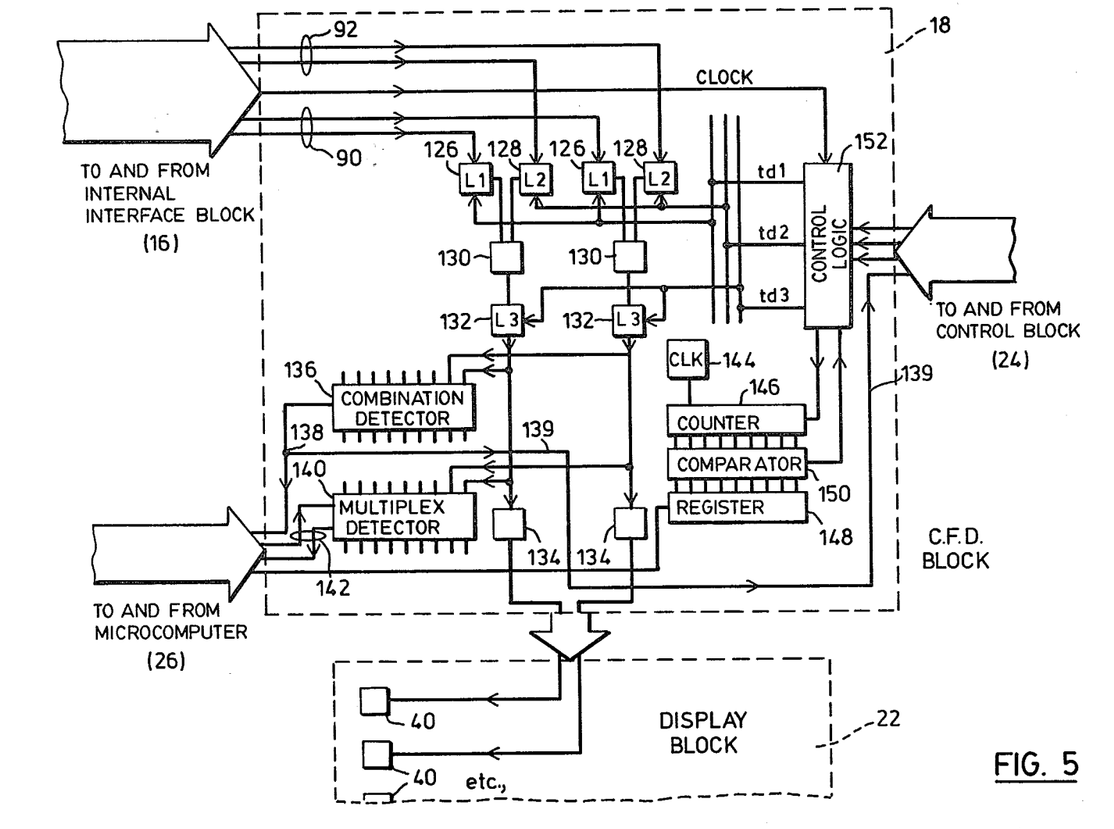
FIG. 5 is a more detailed schematic diagram of the comparison and fault detection block.
Figure 6:
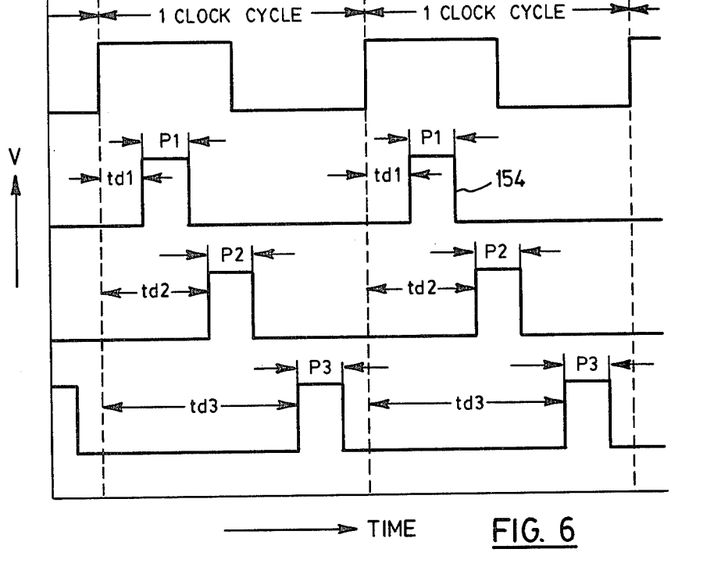
FIG. 6 is a timing diagram to illustrate the timing system used in the comparison and fault detection block.

Turning now to FIGS. 5 and 6 the C.F.D. block receives signals from the library block 20 via leads 90, and from the I.I. block 16 via leads 92; these signals are fed to respective high speed memory elements (latches) 126 and 128, also labelled $L_1$ and $L_2$, and thence to a respective combinatorial logic element 130. The output from each element 130 is fed to a respective high speed memory element (latch) 132, also labelled $L_3$.

If the digital signals received by an element 130 do not correspond it detects the lack of correspondence as a fault and activates a driver 134 that lights the respective lamp 40 in the display block 22. The outputs of all of the elements 130 are fed to a combination detector device 136 that feeds a "fault detected" signal on lead 138 to the microcomputer, so that it will give an indication of a fault detection. The device feeds a corresponding signal on lead 139 to the C.F.D. block, so as to "stop" the test immediately with the fault or faults indicated, since otherwise the test might move on to a situation where there is no fault and the fault indication would be lost. At the same time all the outputs are fed to a multiplex detector register 140 that can be interrogated by the microcomputer via leads 142 to determine which of the device pins have been detected as faulty and provide a read-out either on the display 34 or some equivalent unit, e.g. a printer.

Owing to the high speed at which the apparatus operates it is necessary to control the operation of the latches 126, 128 and 132 so that the signals are sampled during precisely controlled time periods. This arrangement also permits compensation for the differing propagation times of signals through the various components from which the apparatus itself is assembled. It also widens the test capability of the apparatus in that devices of the same configuration but of different families, and thereof of different response speeds, can be tested without the need for exact correspondence between the test and library devices. For example a Schottky (fast TTL) library device can be used to test a TTL or LS device of the same configuration.

A high speed clock 144 feeds a rupple counter 146 which produces the necessary large number of uniform pulses. Information as to the time delays $td_1$, $td_2$ and $td_3$ required for the particular device are supplied by the microcomputer block to a register 148 after this information has been extracted by it from the R.O.M. 100 in the respective library board. The counter 146 and register 148 feed a comparator 150 which in turn feeds the selected pulses to a control logic module 152 that is also fed with the appropriate clock signal to synchronise its operation with the test device. Referring to FIG. 6 a pulse is fed after time delay $td_1$ from the start of the respective clock cycle to open latches $L_1$ and the signals from the I.I. block 16 are sampled during the period $P_1$. Latches $L_2$ are opened for another period $P_2$ that occurs after time delay $td_2$ to sample the signals from the library block 20, while latches $L_3$ are opened for a last period $P_3$ that occurs after time delay $td_3$ to sample the outputs of the combinatorial logic devices 130. All three pulses occur within one clock cycle and there is no overlap between them, so that the actual speed of operation of the tested device and the propagation times through the apparatus are immaterial as long as this condition can be fulfilled. In a particular preferred embodiment operating at 5 Mhz the length of one clock cycle will be 200 nanoseconds and each pulse will typically have a duration of 20 nanoseconds.

Control Block 24

Figure 7:
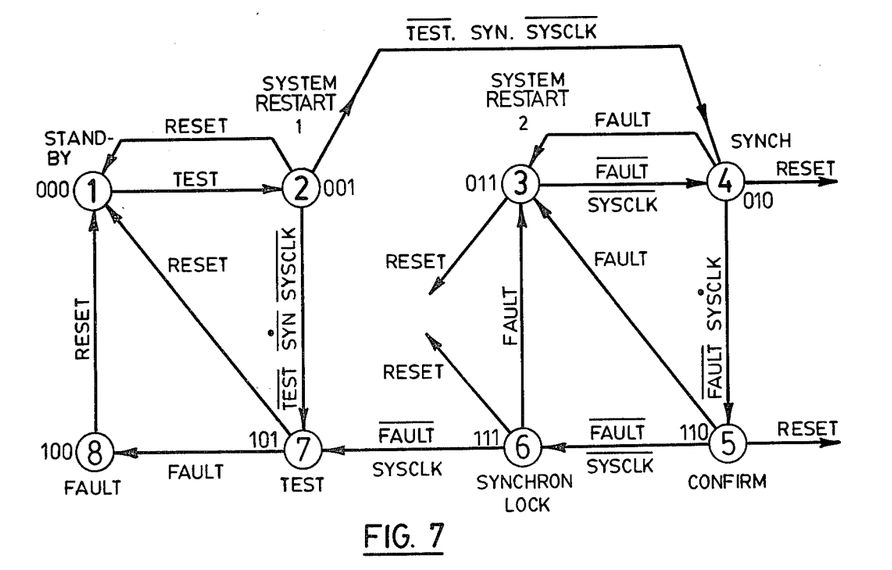
FIG. 7 is a logic diagram to show the operation of the control block in controlling the operation of the other blocks of the preferred embodiment.
Figure 8:
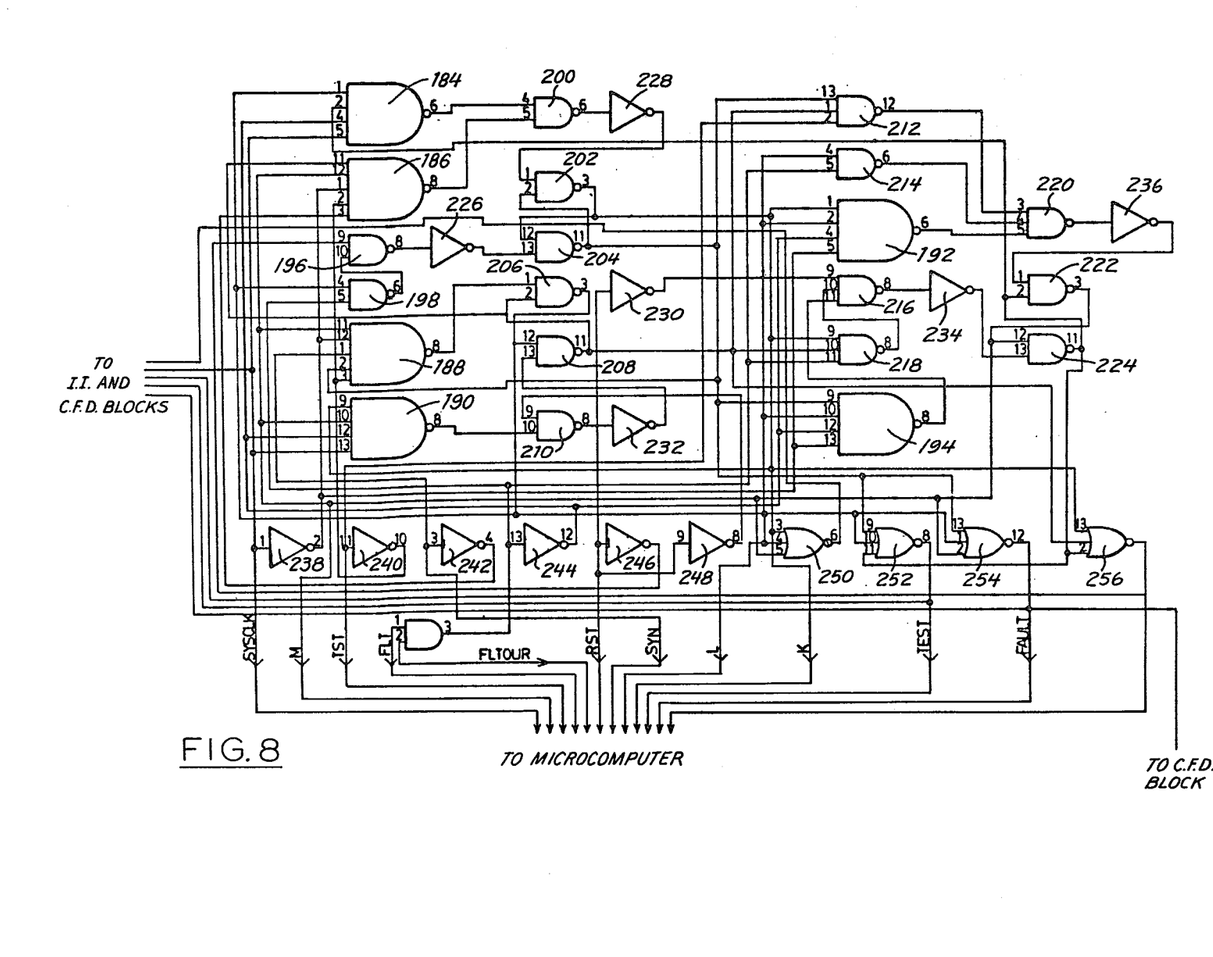
FIG. 8 is a detailed logic circuit for implementing the logic diagram of FIG. 7.

Reference is now made to FIGS. 7 and 8 which are respectively a logic diagram to show the manner in which the control block is employed to control the other blocks of the apparatus and to issue control signals to those other blocks as required, and a specific circuit for that purpose. The circuit is of pulsed asynchronous logic configuration employing TTL Schottky NAND logic gates of the 74S-family e.g. 74S00; 74S10; 74S20 and 74S30. Other families and other logic systems can of course be employed, as will be fully apparent to those skilled in the art.

Upon powering-up of the apparatus it is required to be in standby mode represented by state 1. If the apparatus is not already in this state then the required prompt is not provided by the microcomputer and accordingly it is driven to the state by the operator pressing a reset key 166, whereupon the microcomputer will issue the necessary instruction signal to the logic. If the operator now presses the test key 38 the microcomputer will issue its test signal that will cause the logic to move asynchronously to state 2, also called system restart I. In this second state the input/outputs to the library block are enabled and those to the C.F.D. block are disabled; also an external reset signal is applied to the test device if it is of the type that requires such a signal.

For devices not requiring an external reset signal, such as simple logic gates, the logic can move directly to Test state 7 in which all inputs/outputs are enabled together with the C.F.D. block 18, provided the following conditions are met:

(a) a test has previously been initiated ($\overline{TEST}$)

(b) the external system clock is at logic zero ($\overline{SYSCLK}$), and (c) the device has been determined previously by examination of the library block memory to be of the type not requiring an external reset ($\overline{SYN}$).

Assuming that the logic is now in state 7, if now a fault is detected, the logic moves to state 8 in which all the inputs/outputs are disabled to stop or "freeze" the apparatus in the fault condition, while all accumulated information from the cycle with regard to the fault is held, so that it can be examined and displayed by the slower-operating microcomputer. A return to standby state 1 is only obtained by issue of the reset signal, for example by the operator. If no fault is detected then upon expiry of the test period the logic issues a reset signal to return directly from state 7 to state 1.

If synchronisation is required at state 2 then the necessary information comes from the library block as described above and with the presence of only conditions (a) and (b) above the logic is now moved to state 4, where the necessary check is made for synchronisation. As described above the lack of "synchronisation" is detected as a "fault", but the logic is not armed to drive the apparatus into "fault state" as in the asynchronous loop containing state 8. Upon detection of this "fault" the logic drives immediately asynchronously to state 3, which is also called system restart 2. In this state 3, as was described above, all inputs into the library block are disabled, but all outputs are enabled and compared, so that the library device is "inactive". As soon as synchronisation is obtained there is no "fault" detected and with the system clock at logic zero the logic returns to state 4; this loop can of course repeat and also states 5 and 6 are employed to confirm that synchronism has been achieved, to take account for example of "glitches" on the clock lines giving false clock indications. States 5 and 6 are operative on opposite levels of the clock signal and if a "fault" is still present at either of these stations the logic will return immediately to station 3 and the cycle repeated. If there is no "fault" indication at state 6 and the system clock is at the required higher level then the logic passes immediately to state 7 and the test takes place. To avoid "lock-out" of the logic in any of the states provision is made for the application of a reset signal at each station that will drive the logic to standby state 1 for the sequence to be repeated.

FIG. 8 illustrates one form of logic circuit to implement the logic diagram of FIG. 7. As indicated above, in practice there are many different ways in which the circuit can be arranged depending upon the logic chosen by the designer. This circuit uses 21 multi-input NAND modules 184 through to 224, 12 inverters 226 through to 248 and 4 NOR modules 250 through to 256 connected as shown. Since all of the elements are interactive a step-by-step explanation of its function would be prolix and is unnecessary for those skilled in the art. The circuit consists essentially of three set/reset registers identified by the initials K, L and M. Register K consists of modules 202 and 204, register L consists of modules 208 and 210, while register M consists of modules 222 and 224, the remaining modules serving for the control of these registers. The following table correlates the settings of the three registers with the numbered states in the logic diagram of FIG. 7.

| State | K | L | M |
|-------|---|---|---|
| 1 | 0 | 0 | 0 |
| 2 | 0 | 0 | 1 |
| 3 | 0 | 1 | 1 |
| 4 | 0 | 1 | 0 |
| 5 | 1 | 1 | 0 |
| 6 | 1 | 1 | 1 |

-continued

| State | K | L | M |
|-------|---|---|---|
| 7 | 1 | 0 | 1 |
| 8 | 1 | 0 | 0 |

Thus it will be seen that to move from state 1 to state 2 the registers K and L remain unchanged (0) while register M is set (1). Again to move from state 3 to state 4 registers K and L remain respectively in their unchanged (0) form and set (1) states while register M must be reset from (1) to (0).

The setting and resetting of the registers also requires the following relations to be present, among the various signals, the period between symbols indicating "or":

$$\text{SET K} = L \cdot \overline{M} \cdot \overline{\text{FAULT}} \cdot \text{SYSCLK} + \overline{L \cdot M \cdot \text{TEST} \cdot \text{SYNCH} \cdot \text{SYSCLK}}$$

$$\text{RESET K} = \text{RESET} + L \cdot \text{FAULT}$$

$$\text{SET L} = \overline{K} \cdot M \cdot \overline{\text{TEST}} \cdot \text{SYNCH} \cdot \text{SYSCLK}$$

$$\text{RESET L} = \text{RESET} + K \cdot M \cdot \overline{\text{FAULT}} \cdot \text{SYSCLK}$$

$$\text{SET M} = \overline{K} \cdot \overline{L} \cdot \text{TEST} + L \cdot \text{FAULT} + \overline{K \cdot L \cdot \text{FAULT}} \cdot \text{SYSCLK}$$

$$\text{RESET M} = \text{RESET} + K \cdot \overline{L} \cdot \text{FAULT} + \overline{K \cdot L \cdot \text{FAULT}} \cdot \text{SYSCLK}$$

Microcomputer Block

As will be apparent to those skilled in the art from the description of the apparatus the performance required for the microcomputer block is well within the capability of many currently available units. The particular preferred embodiment described employs an Intel 8085 based central processor unit together with four No. 2732 EPROMS each of four kilobytes capacity; four No. 2114 static RAMS each of half kilobytes capacity; and three No. 8155 static RAMS each of 1.5 kilobytes capacity and 16 I/O ports to provide a total of 48 I/O ports.

It will be seen that all of the different blocks of the apparatus can be constructed using hardware only, since their individual functions are fixed, and the only software and/or firmware needed is in the microcomputer, which can be a readily available unit. Moreover the speed of operation of the various blocks, and therefore of the complete apparatus, is independent of the speed of operation of the microcomputer, which typically is much slower than is possible with a hardware-only block. For example, as described above a preferred minimum speed of operation of the hardware of the preferred embodiment during a test is at 50 Megaherz; the operating speed of a suitable microcomputer is about 4 Megaherz, but each instruction of the microcomputer requires at least several machine cycles for its execution, so that its actual operating speed is only a fraction of the speed of which the test apparatus is capable. This slower speed of the computer block is immaterial since the testing by the hardware portion of the apparatus is independent of the computer. The resultant apparatus can therefore readily be provided as a "turnkey" unit not requiring any software programming by the user.

A particularly advantageous characteristic of the apparatus of the invention is that it is not necessary to know the internal construction or mode of operation of the test device for it to be tested successfully, as long as information is available as to the status of its pins during operation.

The apparatus can therefore be used to test a proprietory or military device for which the manufacturer is unwilling or unable to provide information as to its operation, and used to test a batch of devices whose operation is unknown as long as one can be sure that a correctly functioning device can be selected to serve as the library device.

Because of the possibilities described above of testing external devices making use of an internal library device that is equivalent but of a different family, the library device having one identification may also be identified as corresponding to a number of different configurations, usually referred to as packages. This information is stored in the respective library R.O.M. 100 and will be displayed by the microcomputer block on the display 34 upon interrogation of the memory, which will show that the device in the library is of "package" type. A package (PKG) key 154 is then pressed, whereupon the microcomputer will present a menu for selection via the numeric pad of the different packages that are available. Such selection actuates the microcomputer block to provide the offsets and time delays required to make the internal device equivalent to the external device, and to set the test period that will result in a satisfactory test.

The use of microcomputer control of the hardware segments of the test apparatus also permits the storage of a test sequence, as is required for example for the examination of a circuit board carrying a number of different devices. This can be accomplished using a "scratchpad" random access memory (RAM) of the computer block, in which case the test sequence that is entered will be lost when the apparatus is powered down. Alternatively, if the apparatus is employed frequently or principally to test a particular board then that test sequence can be stored in the computer block by a programmable read only memory unit (PROM).

If the operator wishes to test with a PROM stored test sequence it is only necessary to press a sequence (SEQ) key 156 when a sequence identification will be produced by the microcomputer on display 34, or a menu will appear if more than one sequence is stored. In this sequence mode the operator places the clip 10 on the first test device and presses test key 38 whereupon the device will be tested. Once the device passes or fails the test the clip is passed to the next device and the next and test keys are pressed again. It will be seen therefore that such a sequence can be conducted by a relatively unskilled operator using only an assembly diagram from which the necessary information has been pre-inserted into the PROM.

A temporary test sequence or program is inserted by operation of program (PROG) key 158, when the display 34 will advise that the apparatus is ready to accept the program and gives it a label. The identification for the first device is entered via the numeric pad and, if present in the library, this is entered in the sequence in the microcomputer RAM. The operator then presses a "next" key 160 and enters the identification for the second device, this procedure being continued to the end of the sequence when an End key 162, used to indicate the end of any data insertion, is pressed. This sequence is now recalled by pressing sequence key 156 and proceeding as with a PROM recorded sequence.

The apparatus includes the usual clear entry key 164 that is used to clear the immediately preceding entry if it has been incorrectly entered. A reset key 166 is also provided in case at any time the operator wishes to terminate the mode in which the apparatus is operating. A selftest (STST) key 168 is also provided for the usual self-testing procedures that are available via the microcomputer.

Figures 9, 10, 11:
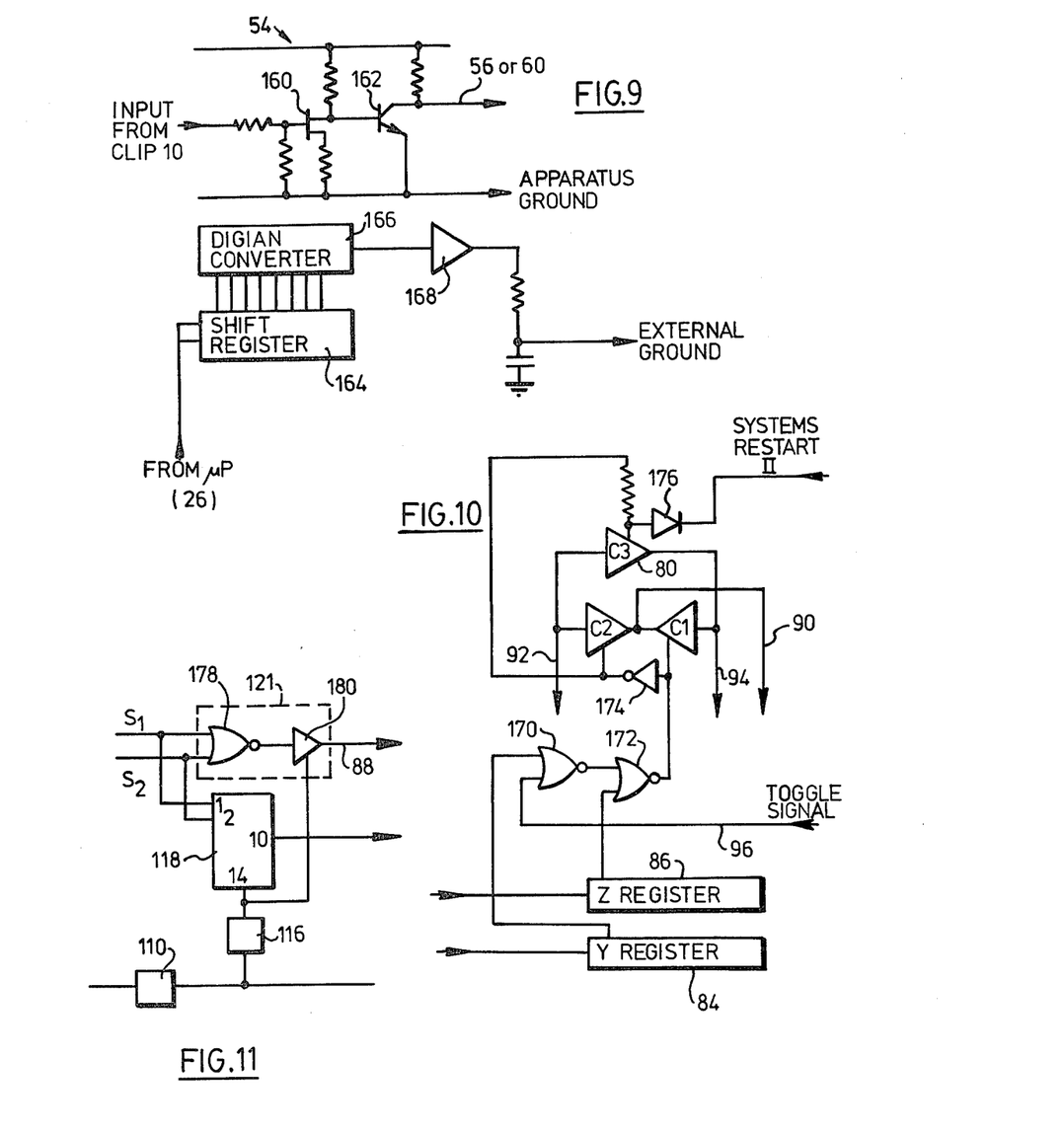
FIG. 9 is a detail from the external interface block of FIG. 2 and also illustrates an alternative embodiment for obtaining offset of the input logic signals.
FIG. 10 is a detail from the internal interface block of FIG. 3 to show a specific structure for control blocks therein.
FIG. 11 is a detail from the library block of FIG. 4 to show the generation of a toggle signal from a toggle logic block thereof.

Referring now to FIG. 9 a preferred form of amplifier 54 for the external interface block consists of a field effect transister (FET) 160 which receives the input from a respective pin of the clip 10, inverts it and feeds it to an NPN transister 162, the output of which feeds on line 56 to the offset modules 58 or, in an alternative embodiment illustrated by this figure, directly on the output line 60 to the I.I. block 16. The signal level changing modules 58 can for example consist of output devices that are switched on and off by the input signals thereto and produce corresponding output signals of the required TTL logic levels. Such an arrangement permits individual control of the signal levels from each pin but may not be necessary, when the simpler system of FIG. 8 can be adopted. Thus, the offset data from the microprocessor 26 takes the form of an eight bit string, and upon selection of the respective device to be tested, this is fed to a shift register 164, the output of which feeds a digital/analog converter 166, the output of which is fed to an amplifier 168. The amplifier output is fed to the ground of the board on which the device being tested is mounted and shifts the ground voltage of that board to a valve such that the signals fed to all of the amplifiers 54 are within the required logic levels to be handled thereby.

Referring now to FIG. 10, which illustrates a specific circuit for the control blocks 82 of FIG. 3, each of the switches 80 therein consists for example of an individually controllable tristate buffer such as the 74126 device sold by Texas Instruments. The Y and Z registers feed respective dual input NOR gates 170 and 172, the toggle signal from control block 24 being fed to gate 170 with the Y bit, while the output of gate 170 is fed to gate 172 with the Z bit. An inverter 174 is connected between the control terminals of switches $C_1$ and $C_2$. The setting for an input signal is a positive bit from the Z register so that the output of NOR gate 172 is low and $C_1$ is disabled; the low signal is inverted by inverter 174 and $C_2$ and $C_3$ are enabled; the presence of a bit from Y is immaterial. The setting for a pure output signal is $Z=0$ and $Y=1$ when NOR 172 has an output enabling $C_1$ and disabling $C_2$ and $C_3$. With both $Z=0$ and $Y=0$ then the state of the switches $C_1$ to $C_3$ depends entirely upon the toggle signal supplied to gate 170. System restart II for synchronisation is obtained by applying the signal via diode 176 to disable switch $C_3$ and thereby prevent the input signals from accessing the library block.

Referring now to FIG. 11, any device to be tested of the type which any of the pins can be alternatively input or output requires a respective toggle logic block 121 to generate the toggle signal that is to be supplied to the internal interface block 16. The arrangement of one such block will now be described: By way of example only it is assumed that the device to be tested is logically simple, in which outputs are obtained on its output pins, such as pin 10, only when signals $S_1$ and $S_2$ on its control pins 1 and 2 are both zero; if $S_1$ or $S_2$ or both are 1 then the output pin 10 is "tristate" i.e. of very high impedance, so that any signals applied thereto from other devices on the bus will be ignored. The "logic block" 121 for such an example reduces to a single NOR gate 178 having its inputs connected to the pins $S_1$ and $S_2$ and its output fed to a controllable tristate buffer 180 which is powered when the respective device is powered and permits the toggle signal to be fed to the internal interface block. The logic block therefore produces a toggle signal logic "1" when the two input signal $S_1$ and $S_2$ are zero, and at all other times will produce toggle signal logic zero to be fed to the gates 170 of FIG. 10.

The high speed memory latches of the C.F.D. block 18 are for example the D-Flip-Flops Type 74273 of Texas Instruments which upon receipt of a signal will hold that signal by remaining in the state to which it was changed by it. The comparator gates are exclusive OR modules type 7486 of Texas Instruments, while the forty element detectors are assembled using for each eight 5-input NOR modules each feeding the input of an 8 input NAND module.

What we claim is:

1. Apparatus for the dynamic in-circuit, element-to-element comparison testing of an electronic digital test circuit element while operative in its circuit comprising:
   means for accessing at least the operative terminals of the test element for its connection to the apparatus and consequent receipt from the said operative terminals thereof of the respective electric signals produced in the usual operation of the circuit in which the test element is connected;
   library means including a plurality of different reference elements and memory means having therein information as to the operating parameters of each of the said reference elements, each reference element being the same as or equivalent to the test element, and each having terminals corresponding to the respective terminals of the respective test element;
   computer means for interrogating the memory means and subsequently effecting powering of a selected reference element in accordance with the said information read by the computer means in the memory means for the selected reference element;
   signal comparison means for comparing the usual operation electric signals at the said operative terminals of the test element with the corresponding signals at the respective terminals of the reference element and for producing a fault indication if the comparison indicates the presence of a fault;
   means for feeding a signal which is an input signal at a terminal of the test element from said accessing means to the corresponding terminal of the reference element, and for feeding a signal which is an output signal at a terminal of the test element to the signal comparison means; and
   means for feeding a signal which is an output signal at a terminal of the reference element to the signal comparison means for comparison with the respective output signal from the test element.

2. Apparatus as claimed in claim 1, wherein said feeding means prevents the feeding of a signal which is an output signal at a terminal of the test element to the corresponding terminal of the reference element.

3. Apparatus as claimed in claim 1, including timing means for sampling during a first time interval the signals from the terminals of the test element to be tested, for sampling during a second time interval the signals from the terminals of the reference element, and for comparing during a third time interval the said signals from the terminals of the test element and the signals from the terminals of the reference element.

4. Apparatus as claimed in claim 3, wherein the said timing means produce the said first, second and third time intervals during a single clock timing period, and there are provided means for selecting the times of occurrence of the said time intervals during the clock timing period.

5. Apparatus as claimed in claim 1, and including external interface means connecting the said accessing means and the remainder of the test apparatus, and means for shifting in the external interface means the voltage level of each signal received from the terminals of the test element to make the resulting output signal from the external interface means compatible with the voltages employed in the said remainder of the test apparatus.

6. Apparatus as claimed in claim 1, and including means for supplying a clock signal to the test element via the said accessing means.

7. Apparatus as claimed in claim 1, and including means for supplying a reset signal to the test element via the said accessing means.

8. Apparatus as claimed in claim 1, and including an indicator for each terminal accessed by the said accessing means, and actuating means for each indicator responsive to an indication of the presence of a fault by the said signal comparison means to actuate the respective indicator.

9. Apparatus as claimed in claim 1, wherein the said feeding means comprise switch means for each terminal of the test element and the corresponding terminal of the reference element in the library means, and means for controlling the said switch means in accordance with the status of each terminal of the test element as an input terminal, an output terminal or a bidirectional terminal.

10. Apparatus as claimed in claim 9, wherein the said controlling means includes means providing signals indicating the status of each terminal of the test device as an input terminal or an output terminal, and there are provided toggle signal generating means providing a signal to the controlling means for final status of a bidirectional terminal as an input or output terminal.

11. Apparatus as claimed in claim 10, wherein the said library means includes a logic means having therein information as to the toggle signal required for the reference element, and the said apparatus includes means for powering the reference element and its logic means to generate the said toggle signal.

12. Apparatus for the dynamic in-circuit, element-to-element comparison testing of an electronic digital test circuit element while operative in its circuit comprising:
   means for accessing at least the operative terminals of the test element for its connection to the apparatus and consequent receipt from the said operative terminals thereof of respective electric signals produced in the usual operation of the circuit in which the test element is connected;
   library means including a plurality of reference digital electronic elements each the same as or equivalent to a respective test element and having terminals corresponding to the respective terminals of the said respective test element, the library means also including memory means having therein information as to the operating parameters of each of the said reference elements;
   means for selecting a reference digital element from the said plurality thereof corresponding to the respective test element to be tested, comprising computer means for interrogating the memory means of the library means and subsequently effecting powering of the selected reference element in accordance with the information read by the computer means in the memory means for the selected reference element; and
   signal comparison means for comparing the usual operation electric signals at the said operative terminals of the test element with the corresponding signals at the respective corresponding terminals of the selected reference element and for producing a fault indication if the comparison indicates the presence of a fault.

13. Apparatus as claimed in claim 12, wherein the said feeding means comprise switch means for each terminal of the test element and the corresponding terminal of the reference element in the library means, and means for controlling the said switch means in accordance with the status of each terminal of the test element as an input terminal, an output terminal or a bidirectional terminal.

14. Apparatus as claimed in claim 13, wherein the said controlling means includes means providing signals indicating the status of each terminal of the test device as an input terminal or an output terminal, and there are provided toggle signal generating means providing a signal to the controlling means for final status of a bidirectional terminal as an input or output terminal.

15. Apparatus as claimed in claim 14, wherein the said library means includes a logic means having therein information as to the toggle signal required for the reference element, and the said apparatus includes means for powering the reference element and its logic means to generate the said toggle signal.

16. Apparatus as claimed in claim 12, and including external interface means connecting the said accessing means and the remainder of the test apparatus, and means for shifting in the external interface means the voltage level of each signal received from the terminals of the test element to make the resulting output signal from the external interface means compatible with the voltages employed in the said remainder of the test apparatus.

17. Apparatus as claimed in claim 12, including timing means for sampling during a first time interval the signals from the terminals of the test element to be tested, for sampling during a second time interval the signals from the terminals of the reference element, and for comparing during a third time interval the said signals from the terminals of the test element and the signals from the terminals of the reference element.

18. Apparatus as claimed in claim 17, wherein the said timing means produce the said first, second and third time intervals during a single clock timing period, and there are provided means for selecting the times of occurrence of the said time intervals during the clock timing period.

19. Apparatus for the dynamic in-circuit, element-to-element comparison testing of an electronic digital test circuit element while operative in its circuit comprising:
   means for accessing at least the operative terminals of the test element for its connection to the apparatus and consequent receipt from the said operative terminals thereof of respective electric signals produced in the usual operation of the circuit in which the test element is connected;

library means including a reference digital electronic element the same as or equivalent to the test element to be tested and having terminals corresponding to the respective terminals of the test element, and memory means having therein information as to the operating parameters of the reference element;

computer means for interrogating the memory means and subsequently effecting the powering of the said reference digital element to a powered state corresponding to that of the said test element;

signal comparison means for comparing the signals at the said operative terminals of the test element with the corresponding signals at the respective corresponding terminals of the reference element in the library means and for producing a fault indication if the comparison indicates the presence of a fault; and means for feeding signals that are input signals to the test element from the accessing means to the library means and to the signal comparison means and for feeding signals that are output signals from the reference element from the library means to the signal comparison means.

20. A library module for use in apparatus for the dynamic in-circuit element-to-element comparison testing of a plurality of different electronic digital test elements while operative in their respective circuits and to which the apparatus is selectively connected, the library module comprising:

a circuit board having thereon a plurality of busbars;

a plurality of electronic digital reference elements connected to the said busbars to permit the selective access to the terminals of each reference element; and a memory means connected to the said busbars for access by a memory interrogation means, said memory means having therein information for each reference element consisting of:

(a) identification of the respective reference element,
(b) identification of the busbars that are accessed for access to the respective reference element,
(c) identification of the status of each operative contact of the respective reference element as to whether it is an input terminal, an output terminal, or a bidirectional terminal which may in operation be alternatively an output terminal or an input terminal.

21. A library module as claimed in claim 20, and including logic means for each reference element having therein information as to the toggle signal required for the reference element for determination of the status of each bidirectional terminal as an input or output terminal.

22. Apparatus for the dynamic in-circuit, element-to-element comparison testing of an electronic digital circuit element while operative in its circuit comprising:

means for accessing at least the operative terminals of the test element for the connection of the test element to the apparatus;

library means including a plurality of individually selectable different reference digital elements, each of which can constitute a reference digital element the same as or equivalent to a respective test element and having terminals corresponding to the respective terminals of the respective test element, and memory means having therein information as to the operating parameters of each of the said reference elements;

computer means for interrogating the memory means and subsequently effecting powering of a selected reference element in accordance with the said information read by the computer means in the memory means for the selected reference element;

means for comparing a test signal at each operative terminal of the test element produced in the usual operation of the circuit in which the test element is connected with a corresponding signal which is a reference signal at the respective terminal of the reference element and for indicating a fault condition when the compared test and reference signals are different;

means for connecting said accessing means, said selected, powered reference element and said comparing means; and routing means routing test signals which are input signals, test signals which are output signals and test signals which are bidirectional signals from said accessing means to the said comparing means, and routing test signals which are input signals and test signals which are bidirectional signals in input signal mode from the accessing means to the respective terminals of the said reference element;

said connecting means connecting the reference element and the comparing means for transmission of reference signals which are output signals and reference signals which are bidirectional signals in output mode to the comparing means.

23. Apparatus as claimed in claim 22, and including an indicator for each terminal accessed by the said accessing means, and actuating means for each indicator responsive to an indication of the presence of a fault by the said signal comparison means to actuate the respective indicator.

24. Apparatus as claimed in claim 22, including timing means for sampling during a first time interval the signals from the terminals of the test element to be tested, for sampling during a second time interval the signals from the terminals of the reference elements, and for comparing during a third time interval the said signals from the terminals of the test element and the signals from the terminals of the reference element.

25. Apparatus as claimed in claim 22, wherein the said routing means comprise switch means for each terminal of the test element and the corresponding terminal of the reference element in the library means, and means for controlling the said switch means in accordance with the status of each terminal of the test element as an input terminal, an output terminal or a bidirectional terminal.

26. Apparatus as claimed in claim 25, wherein the said controlling means includes means providing signals indicating the status of each terminal of the test device as an input terminal or an output terminal, and there are provided toggle signal generating means providing a signal to the controlling means for final status of a bidirectional terminal as an input or output terminal.

27. Apparatus as claimed in claim 26, wherein the said library means includes a logic means having therein information as to the toggle signal required for the reference element, and the said apparatus includes means for powering the reference element and its logic means to generate the said toggle signal.

28. Apparatus as claimed in claim 22, and including external interface means connecting the said accessing means and the remainder of the test apparatus, and means for shifting in the external interface means the voltage level of each signal received from the terminals of the test element to make the resulting output signal from the external interface means compatible with the voltages employed in the said remainder of the test apparatus.

* * * * *